United States Patent [19]

Campbell

[11] 3,771,207

[45] Nov. 13, 1973

[54] STEPPED LENGTH LEAD LOCATOR AND TRIMMER

[75] Inventor: Lester L. Campbell, Anaheim, Calif.

[73] Assignee: Hughes Aircraft Company, Culver City, Calif.

[22] Filed: Aug. 21, 1972

[21] Appl. No.: 282,524

[52] U.S. Cl. .............................. 29/203 H, 29/203 P

[51] Int. Cl. .............................. H05k 13/04

[58] Field of Search .............................. 29/203 H, 203 P, 29/200 H, 203 HT, 203 HC

[56] References Cited

UNITED STATES PATENTS

| | | | |
|---|---|---|---|
| 3,321,825 | 5/1967 | Cooke | 29/203 P |
| 3,531,846 | 10/1970 | Gurley | 29/203 H |

*Primary Examiner*—Thomas H. Eager

*Attorney*—W. H. MacAllister, Jr. et al.

[57] ABSTRACT

The leads of a TO-5 or other similar electronic component package are trimmed to a stepped length, chisel-ended configuration by means of a lead locator and trimmer tool having two pivoted dies having respective contraposed shearing surfaces intersected at an acute angle by parallel lead pilot holes. In one particular embodiment, handles attached to the dies cause these shearing surfaces to transversely pivot with respect to each other, whereby the trimming operation is performed.

4 Claims, 4 Drawing Figures

STEPPED LENGTH LEAD LOCATOR AND TRIMMER

BACKGROUND OF THE INVENTION

Integrated circuits (for instance, operational amplifiers, flip-flops, and multivibrators) are commonly packaged in a small, hermetically sealed, multiple lead can known as a TO–5 package. Such a package has its leads (eight for example) arranged in a circle and projecting downwards parallel to one another from the body of the package, much in the manner of a vacuum tube. However, the leads are fragile (being 0.016 to 0.019 inch in diameter), tightly packed (for instance, eight in a circle of 0.2 inch diameter), and all of the same length (approximately 0.5 inch). Consequently, great manual dexterity is required to simultaneously introduce all leads into the corresponding miniature socket on a printed circuit board without bending or otherwise damaging any of the leads.

Accordingly, a broad object of the present invention is to provide a tool for facilitating the insertion of packaged components into their respective sockets by appropriate trimming of leads.

A second object of the present invention is to provide a tool for trimming the leads of packaged components such that the leads have variable lengths.

A further object of the present invention is to provide a tool for trimming the leads of a component package with chisel-shaped ends. One rather narrow object of the present invention is to provide a multiple lead locating and trimming tool having countersunk lead-in portions to facilitate positioning of the leads with respect to the tool.

Still another narrow object of the present invention is to provide a multiple lead locating and trimming tool which is provided with spring-loaded handles and an adjusting screw for convenient single-handed operation.

The invention which satisfies these and other objects comprises a tool having two dies with respective contraposed transversely pivoted shearing surfaces intersected at an acute angle by a plurality of parallel pilot holes arranged in a pattern corresponding to the leads of a particular package configuration, a locating means being provided in order to locate the packaged electrical component with respect to the shearing surfaces. By rotating the shearing surfaces with respect to each other about the pivot, a component having its leads inserted in the respective pilot holes will have its leads sheared off at varying lengths as determined by the geometry of the locating means with respect to the contraposed shearing surfaces.

BRIEF DESCRIPTION OF THE DRAWINGS

Other details and advantages of the present invention may be gained from a study of the following detailed description of a preferred embodiment of the present invention and the referenced figures of the drawings in which.

DETAILED DESCRIPTION OF A PREFERRED EMBODIMENT

Figures 1, 2, 3, 4:
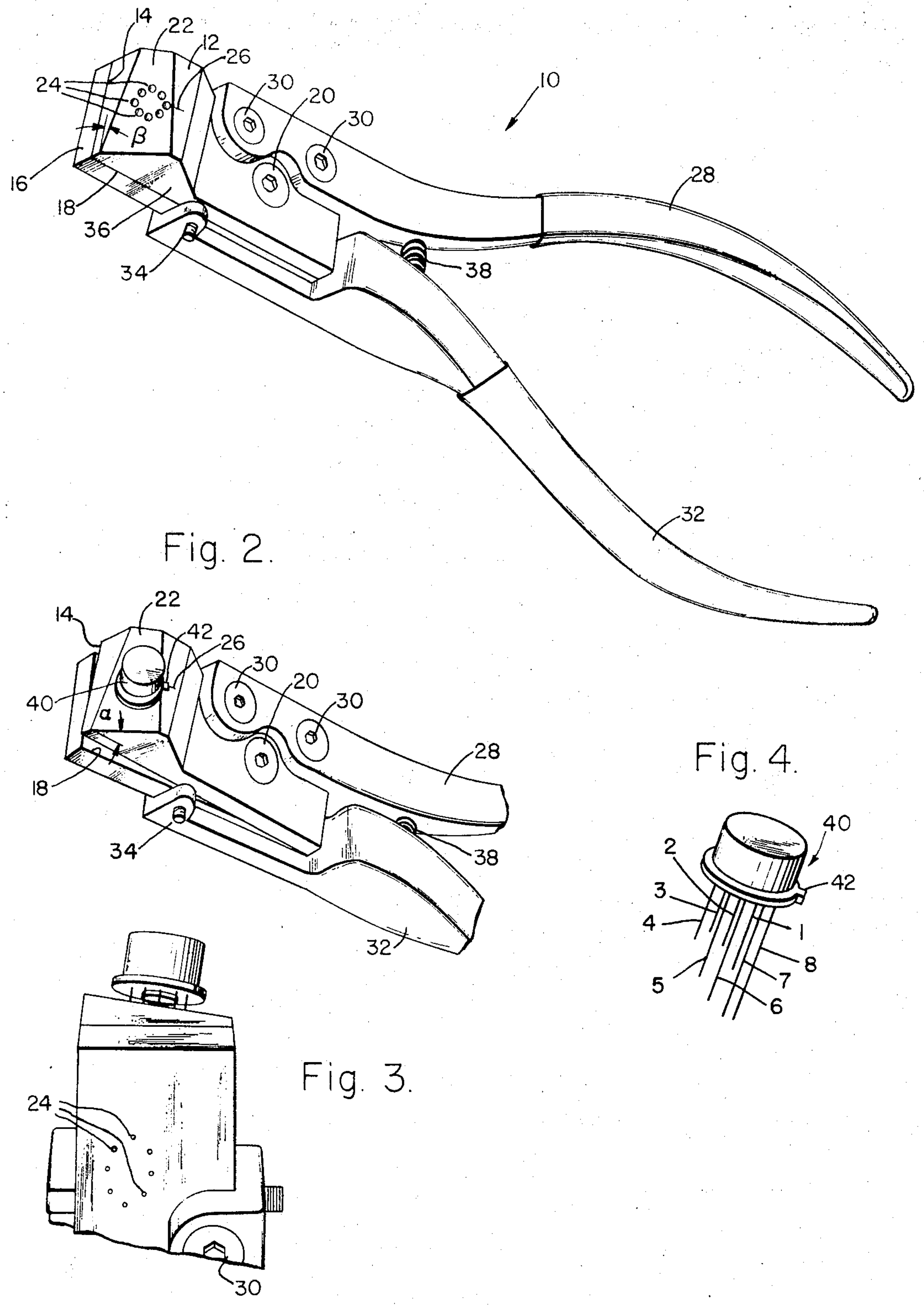
FIG. 1 shows a preferred embodiment of the tool of the present invention prior to the insertion of an electronic component.
FIG. 2 shows the same tool with an electronic component inserted therein and a shearing operation completed.
FIG. 3 shows a portion of the tool of FIG. 1 from the underside prior to the shearing operation, an electrical component having already been inserted.
FIG. 4 shows a TO–5 or other similar electronic component package after its leads have been sheared to various lengths by a tool such as that illustrated in FIG. 1.

Referring now with greater particularity to FIG. 1 of the drawing, it may be seen that a stepped length lead trimmer tool 10 includes an upper cutting die 12 of hardened tool steel having an upper shearing surface 14, a lower cutting die 16 (also of hardened tool steel) having a lower shearing surface 18 (more visible in FIG. 2) contrapositive to the upper shearing surface 14, the upper and lower dies being pivotally mounted one with respect to the other about a pivot screw 20, so that the contraposed shearing surfaces 14 and 18 may have an arcuate transverse motion one with respect to the other. Upper die 12 also includes a locating surface 22 perpendicular to which a circular arrangement of pilot holes 24 (corresponding to the leads of a TO–5 package) are provided. Locating surface 22 is not parallel to shearing surfaces 14 and 18 but rather makes an acute angle therewith; consequently, the circular arrangement of holes 24 on surface 22 appears as an elliptical arrangement of holes at the shearing surfaces 14 and 18. Holes 24 are continued without interruption through lower die 16. The elliptical configuration of pilot holes at the shearing surfaces 14 and 18 resembles that visible (in FIG. 3) at the bottom surface of lower die 16.

The upper ends of pilot holes 24 are preferably countersunk to facilitate the simultaneous manual introduction of the leads. The diameter of the holes 24 should be sufficiently larger than that of the leads being inserted as to not cause binding (0.025 inch for example, which provides from 0.006 to 0.009 inch of clearance for a TO–5 package).

In the preferred embodiment of the invention, locating surface 22 is located at a compound angle with shearing surfaces 14 and 18. That is to say, not only does surface 22 make a first acute angle $\alpha$ (FIG. 2) from front to rear of the tool (approximately 45° in the embodiment illustrated), but it also makes a second, more acute angle $\beta$ (FIG. 1) from right to left (approximately 15°). This has the desirable effect of producing a pattern of trimmed leads such that the longest lead is diametrically opposite the shortest lead and leads to the right of the diametrical line, from the longest lead to the shortest, are slightly longer than the corresponding leads on the left.

A TO–5 package 40 is normally inserted in the tool 10 with its lug 42 adjacent to the index mark 26 punched on the upper surface of upper die 12, as shown in FIG. 2. Thus, using the conventional numbering for an eight-lead TO–5 package (lead number 8 is adjacent the polarizing lug 42 and the leads are numbered clockwise from underneath), it may be seen that a TO–5 package having its leads trimmed in accordance with the illustrated preferred embodiment of the invention will have as its longest lead lead 8 followed by 1, 7, 2, 6, 3, 5, with lead 4 being the shortest. FIG. 4 shows an eight-lead TO–5 package 40 with its leads trimmed in accordance with the present invention. The leads in the figure have been numbered in accordance with the above mentioned conventional numbering, with lead 8 adjacent the polarizing lug 42. It can be clearly seen that each lead is of a slightly different length (varying by approximately 0.030 inch increments if the dimensions and angles quoted above are adhered to) and that each lead terminates in a sharp, chisel-shaped point as viewed from the side. This combination of stepped lead lengths and chisel-shaped lead ends has proven especially valuable in preventing damage to leads and in expediting the assembly of a packaged component in its socket.

Referring back to FIG. 1 it may also be seen that upper die 12 has a handle 28 attached to it by means of fixing screws 30 and that lower die 16 has attached to it a similar handle 32 (in the preferred embodiment illustrated identical to handle 28 but inverted). Handle 32 is provided with an adjusting screw 34 which may contact with adjacent surface 36 of upper die 12. Return spring 38 located between the handles 28 and 32 causes the tool to assume a rest position (adjustable by means of screw 34) in which upper and lower portions of holes 24 are exactly in line.

Although the invention has been described in connection with an eight-lead TO–5 package configuration, it will be obvious to those skilled in the art to practice this invention with other lead configurations, for example, six or 10 leads (by providing six or 10 pilot holes 24), or with packages larger or smaller than the TO–5 (by appropriately scaling the relevant dimensions and angles).

What is claimed is:

1. A tool for trimming the parallel leads of an electronic component comprising:

a first die having a first shearing surface;

a second die pivotally mounted with respect to said first die, said second die having a second shearing surface contraposed to said first shearing surface;

a plurality of mutually parallel pilot holes intersecting at an acute angle said first and second shearing surfaces;

locating means for locating the leads of the component to be trimmed with respect to said pilot holes and said shearing surfaces; and means for transversely pivoting one of said shearing surfaces with respect to the other, whereby a component having its leads inserted in said pilot holes will have its leads sheared off at varying lengths.

2. The tool of claim 1 wherein said acute angle is a compound angle comprising a first greater angle in a longitudinal plane from front to rear of said tool and a second lesser angle in a lateral plane perpendicular to said longitudinal plane.

3. The tool of claim 1 wherein said first die is marked in the vicinity of the longest of said pilot holes and wherein each of said pilot holes is provided with a countersunk lead-in portion.

4. The tool of claim 1 wherein said means for pivoting comprises a pair of essentially identical handles respectively attached to said first and to said second dies; a return spring connected between said pair of handles for returning said dies to their normal, aligned position; and an adjusting screw co-acting with one of said handles and with one of said dies for adjusting said normal aligned position.

* * * * *